United States Patent
Gopinath et al.

(10) Patent No.: US 6,544,829 B1
(45) Date of Patent: Apr. 8, 2003

(54) POLYSILICON GATE SALICIDATION

(75) Inventors: Venkatesh Gopinath, Fremont, CA (US); Mohammad Mirabedini, Redwood City, CA (US); Charles E. May, Gresham, OR (US); Arvind Kamath, Mountain View, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/251,016

(22) Filed: Sep. 20, 2002

(51) Int. Cl.$^7$ .......................................... H01L 21/8238
(52) U.S. Cl. ........................ 438/232; 438/634; 438/656
(58) Field of Search ................................. 438/199, 223, 438/227, 231, 232, 592, 634, 655, 656

(56) References Cited

U.S. PATENT DOCUMENTS

| | | | |
|---|---|---|---|
| 4,656,731 A | * | 4/1987 | Lam et al. .................. 438/233 |
| 6,127,212 A | * | 10/2000 | Chen et al. .................. 438/232 |
| 6,133,128 A | * | 10/2000 | Das et al. .................... 438/585 |
| 6,214,656 B1 | * | 4/2001 | Liaw ........................... 438/199 |

OTHER PUBLICATIONS

Travel et al., *Totally Silicided (CoSi2) Polysilicon: a novel approach to very low–resistive gate (~2 ohms/square) without metal CMP nor etching*, IEEE, 2001.

* cited by examiner

*Primary Examiner*—Chandra Chaudhari
(74) *Attorney, Agent, or Firm*—Luedeka, Neely & Graham, PC

(57) ABSTRACT

A method of fabricating a substantially completely silicided polysilicon gate electrode in a CMOS process flow. A hard mask material is formed on an integrated circuit substrate, where the integrated circuit substrate includes an unpatterned polysilicon layer that overlies a gate oxide layer, and a well region disposed between isolation structures. Portions of the hard mask material are removed to define gate electrode masks that overlie first portions of the unpatterned polysilicon layer and the gate oxide layer, leaving exposed second portions of the unpatterned polysilicon layer and the gate oxide layer. The integrated circuit substrate is exposed to a dopant that passes through the second portions of the gate oxide layer but does not penetrate the first portions of the gate oxide layer that underlie the gate electrode masks, which defines source drain regions in the well region. The exposed second portions of the unpatterned polysilicon layer are removed to define polysilicon gate electrode precursors under the gate electrode masks. The gate electrode masks are removed from the polysilicon gate electrode precursors, and a metal layer is deposited over the polysilicon gate electrode precursors and the source drain regions. The integrated circuit substrate is annealed to substantially completely consume the polysilicon gate electrode precursors and form silicide gate electrodes from the polysilicon gate electrode precursors and the overlying metal layer, by which silicide contacts in the source drain regions are also formed.

20 Claims, 3 Drawing Sheets

POLYSILICON GATE SALICIDATION

FIELD

This invention relates to the field of integrated circuit fabrication. More particularly, this invention relates to improving gate functionality in metal oxide semiconductor field effect transistors.

BACKGROUND

Integrated circuits, such as CMOS devices, typically use polysilicon as the preferred gate electrode material. The polysilicon gates are typically doped to increase their conductivity. For example, a PMOS gate is generally doped with p+ dopants, and an NMOS gate is typically doped with n+ dopants.

As the device dimensions of integrated circuits have been continually reduced, new issues in regard to device operation and reliability have arisen. Devices manufactured with deep submicron dimensions tend to be more powerful and faster, but tend to require a thinner gate oxide to provide sufficient current drive as the supply voltage is scaled down. As the gate oxide thickness decreases, issues such as gate depletion become more of a problem and create additional constraints, often with competing interests, on fabrication parameters such as gate doping and annealing conditions.

For example, the gates of an integrated circuit are often doped at the same time as the source and drain regions of the device. However, as the gate oxide is reduced in thickness, this standard practice tends to have competing interests. If the dopant level and the anneal temperature are relatively low, then active dopant concentration at the interface between the gate electrode and the gate dielectric also tends to be relatively low, resulting in a depletion of the dopant in the gate electrode near the gate dielectric when the channel is inverted, especially when a relatively strong bias is applied. In such a situation the conduction band in the gate depletion region tends to bend, causing a voltage drop and an effective reduction in gate voltage, which reduces the current drive through the channel.

On the other hand, if the effective dopant level in the gate electrode is increased such as with a higher implant dose or anneal temperature, the implanted and activated dopant tends to penetrate the gate oxide and enter the channel region. This situation tends to cause charge trapping in the gate oxide and variations in the threshold voltage. The problems caused by these competing issues of gate depletion and dopant penetration tend to increase as gate oxide thickness is decreased.

What is needed, therefore, is a method of fabricating an integrated circuit with a CMOS compatible process flow, where the problems of gate depletion and dopant penetration are reduced.

SUMMARY

The above and other needs are met by a method of fabricating a substantially completely silicided polysilicon gate electrode in a CMOS process flow. A hard mask material is formed on an integrated circuit substrate, where the integrated circuit substrate includes an unpatterned polysilicon layer that overlies a gate oxide layer, and a well region disposed between isolation structures. Portions of the hard mask material are removed to define gate electrode masks that overlie first portions of the unpatterned polysilicon layer and the gate oxide layer, leaving exposed second portions of the unpatterned polysilicon layer and the gate oxide layer. The integrated circuit substrate is exposed to a dopant that passes through the second portions of the gate oxide layer but does not penetrate the first portions of the gate oxide layer that underlie the gate electrode masks, which defines source drain regions in the well region.

The exposed second portions of the unpatterned polysilicon layer are removed to define polysilicon gate electrode precursors under the gate electrode masks. The gate electrode masks are removed from the polysilicon gate electrode precursors, and a metal layer is deposited over the polysilicon gate electrode precursors and the source drain regions. The integrated circuit substrate is annealed to substantially completely consume the polysilicon gate electrode precursors and form silicide gate electrodes from the polysilicon gate electrode precursors and the overlying metal layer, by which silicide contacts in the source drain regions are also formed.

In this manner, a substantially completely silicided gate electrode is formed in a relatively standard CMOS process flow. A hard mask is used to define the polysilicon gate electrode precursor, which is often done in a standard CMOS process flow. However, the unpatterned polysilicon layer is deposited to a thickness that can be substantially consumed in the later silicide process, rather than to some other thickness, and the hard mask is left in place during the source drain dopant implant. The combined thickness of the hard mask and the polysilicon layer is sufficient to prevent the dopant implant from entering the gate oxide below the gate area. Thus, the substantially completely silicided gate removes the problems associated with dopant depletion during operation of the gate, and the combined thickness of the hard mask and the polysilicon layer during gate dopant implant reduces and preferably eliminates any dopant concentration in the gate oxide.

In various preferred embodiments of the invention, the combined first thickness of the hard mask material and the second thickness of the unpatterned polysilicon layer are sufficient to prohibit the dopant from penetrating the first portions of the gate oxide layer. The thickness of the metal layer is preferably just sufficient to substantially completely consume the thickness of the polysilicon gate electrode precursors and form silicide gate electrodes during the annealing step. The thickness of the unpatterned polysilicon layer is preferably between about three hundred angstroms and about four hundred angstroms, the thickness of the hard mask material is preferably between about three hundred angstroms and about eight hundred angstroms, and the thickness of the metal layer is preferably between about one hundred angstroms and about two hundred angstroms.

The hard mask material is preferably formed of a material such as at least one of silicon nitride, silicon oxide, and silicon oxynitride, and most preferably silicon nitride, and the metal layer is formed of at least one of cobalt, nickel, titanium, platinum, and tantalum. The unpatterned polysilicon layer is doped in varying embodiments to tailor the work function of the silicide gate electrodes, at a point during processing that includes one or more of prior to formation of the hard mask material, prior to the deposition of the metal layer, and after formation of the silicide gate electrodes.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
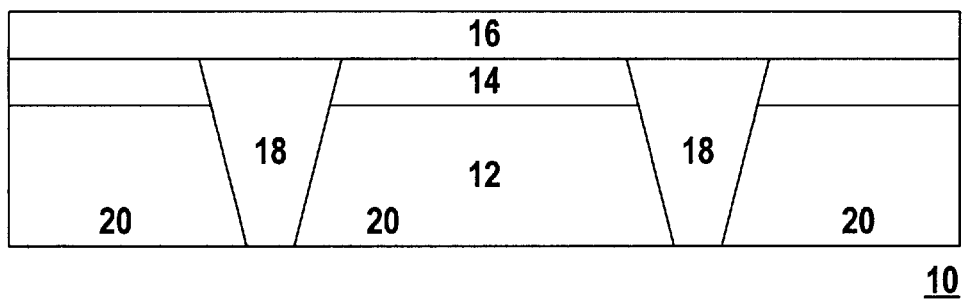
FIG. 1 is a cross sectional representation of an integrated circuit substrate, including an unpatterned polysilicon layer overlying a gate oxide layer, and well regions bounded by isolation structures.

With reference now to FIG. 1, there is depicted a cross sectional representation of an integrated circuit substrate 10, including an unpatterned polysilicon layer 16 overlying a gate oxide layer 14, and well regions 20 formed in a semiconducting substrate 12 bounded by isolation structures 18. The descriptive term "integrated circuit substrate 10" as used herein typically includes all of the structures and layers that have been previously deposited and formed at a given point in the processing, and is not necessarily limited to just those structures and layers as depicted in FIG. 1. However, FIG. 1 depicts an integrated circuit substrate 10 at a point in the processing where the more novel aspects of the present invention begin.

Preferably, the semiconducting substrate 12 is formed of any one or more of a semiconducting material such as silicon, germanium, or a III–V compound such as gallium arsenide. In a most preferred embodiment, however, the semiconducting substrate 12 is formed of silicon. The isolation structures 18 are preferably formed of an oxide of the semiconducting substrate 12, and most preferably formed of silicon dioxide, such as by using a shallow trench isolation process. The wells 20 are doped with either n or p type doping, depending on whether a PMOS or NMOS device is to be created in the well, as is known in the art. Preferably, devices of both types are formed in the integrated circuit substrate 10, so as to form CMOS devices. Therefore, the following novel process step combinations of the preferred method of the invention as described below are all consistent with a CMOS process flow.

The gate oxide layer 14 is preferably an oxide of the semiconducting substrate 12, and most preferably silicon dioxide, but may also be a material such as a high-K deposited dielectric. The polysilicon layer 16 is preferably undoped at this point in the processing, or if a light dopant has been added to the layer 16 during the formation of the polysilicon layer 16, then the dopant is at a relatively low level, which level is insufficient either to allow proper operation of the gate electrode that is to be formed in the polysilicon layer 16, or to diffuse into the gate oxide layer 14 to any appreciable degree. However, doping of the polysilicon layer 16 during formation of the layer can be used to tailor the work function of the gate electrode that will eventually be formed.

In a most preferred embodiment, the polysilicon layer 16 is formed to a thickness of between about three hundred angstroms and about four hundred angstroms. The reason for this preferred range of thicknesses is given with more detail below. At the point in processing as depicted in FIG. 1, the polysilicon layer is unpatterned, meaning that gate structures have not as yet been patterned or etched in the polysilicon layer 16. However, in some embodiments of the method of the invention, the polysilicon layer 16 may have been planarized in some manner at this point in the processing of the integrated circuit substrate 10.

Figure 2:
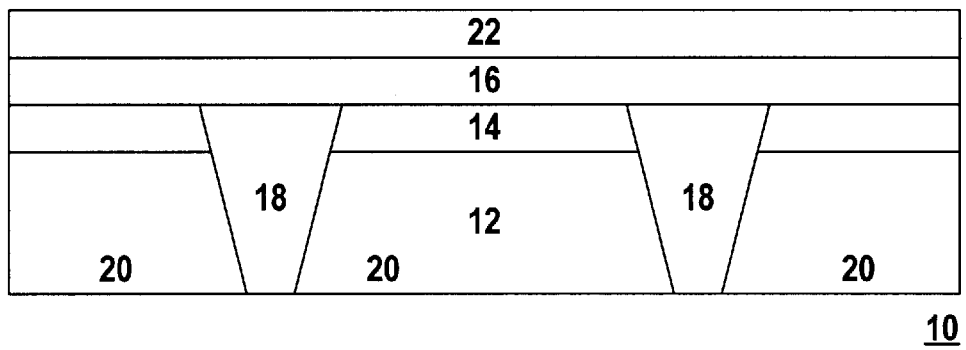
FIG. 2 is a cross sectional representation of the integrated circuit substrate, with an overlying hard mask layer.

With reference now to FIG. 2, there is depicted the integrated circuit substrate 10 as described in regard to FIG. 1, whereon a hard mask material 22 has been formed on top of the polysilicon layer 16. The hard mask material 22 is preferably formed of silicon nitride, but may be formed of any material that is compatible with the material, structures, and methods as described herein, such as silicon oxide and silicon oxynitride. The hard mask material 22 is preferably formed to a thickness of between about three hundred angstroms and about eight hundred angstroms. The reason for this preferred range of thicknesses is also given with more detail below.

Figure 3:
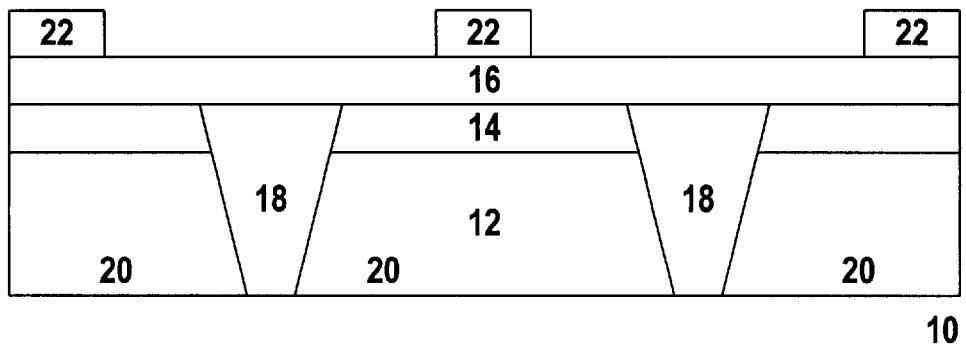
FIG. 3 is a cross sectional representation of the integrated circuit substrate, with a patterned gate electrode mask.

FIG. 3 depicts the integrated circuit substrate 10, where the hard mask material 22 has been patterned and etched to form gate electrode masks 22. The gate electrode masks 22 are formed so as to overlie first portions of the integrated circuit substrate 10, including first portions of the polysilicon layer 16, first portions of the gate oxide layer 14, and first portions of the well regions 12, wherein gate electrodes and channels of the MOS devices are to be formed. Similarly, the formation of the gate electrode masks 22 leaves second portions of the polysilicon layer 16, second portions of the gate oxide layer 14, and second portions of the well regions 12 exposed, wherein source drain regions are to be formed.

Processing according to the preferred method of the present invention preferably always proceeds to this point in the order of process steps as described above. However, at this point in the processing, the various process steps can be performed according to one or more different process flows, depending upon parameters as described in more detail below, where some of the example process flows are described. These alternate process flows generally differ by when the impregnation of the dopant is accomplished in relation to a few of the other process steps. However, other process options are also presented below.

Figure 4:
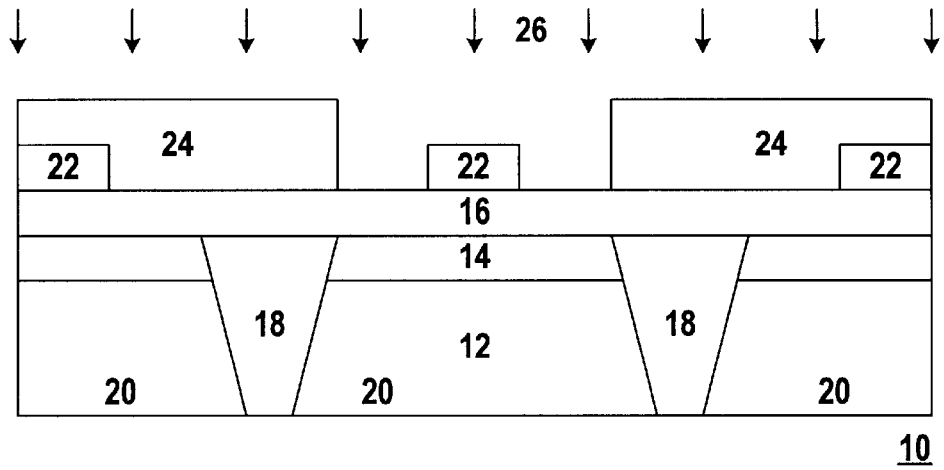
FIG. 4 is a cross sectional representation of the integrated circuit substrate, receiving a source drain deep implant through a soft mask, where the gate electrodes have not as yet been defined in the gate electrode layer.

For example, FIG. 4 depicts the integrated circuit substrate 10 receiving a dopant implant 26 at a point in the process flow just after that as depicted in FIG. 3, where a soft mask 24 has been applied to the integrated circuit substrate 10, so as to limit the implant 26 just to those areas of the integrated circuit substrate 10 that are to receive an implant of that dopant type, such as a p+ implant. However, the polysilicon layer 16 is still unpatterned at this time, in that the gate electrodes or their precursors have not as yet been formed in the polysilicon layer 16.

It is appreciated that after such a dopant implant 26, the soft mask 24 is preferably removed and reapplied so as to expose other portions of the integrated circuit substrate 10, and a dopant of another type, such as an n+ dopant, is implanted into other structures of the integrated circuit substrate 10, so as to form CMOS devices in a manner generally known in the art. However, for the sake of more fully concentrating on those aspects of the process which are novel to the present invention, the complete description of such mundane details is omitted from the present discussion.

Figure 5:
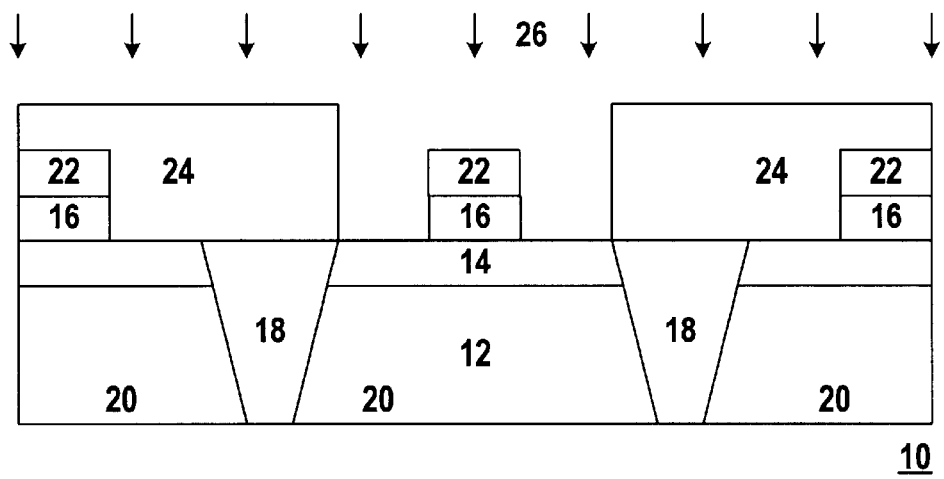
FIG. 5 is a cross sectional representation of the integrated circuit substrate, receiving a source drain deep implant through a soft mask, where the gate electrodes have already been defined in the gate electrode layer.

FIG. 5 depicts an alternate embodiment in which the dopant implant 26 is accomplished after the gate electrode precursors 16 have been formed from the polysilicon layer 16, such as in an etching operation. The structures are called precursors 16 because there are subsequent process steps to be accomplished in regard to the precursors 16 before they are formed into completed gate electrodes. The gate electrode precursors 16 are formed in the first portion of the polysilicon layer 16, which is protected from the etchant, whether it is a wet or dry etchant, by the gate electrode masks 22. However, as described above in regard to FIG. 4, the soft mask 24 is preferably formed over the integrated circuit substrate 10 so as to limit the implant 26 to specific portions of the integrated circuit substrate 10.

Figure 6:
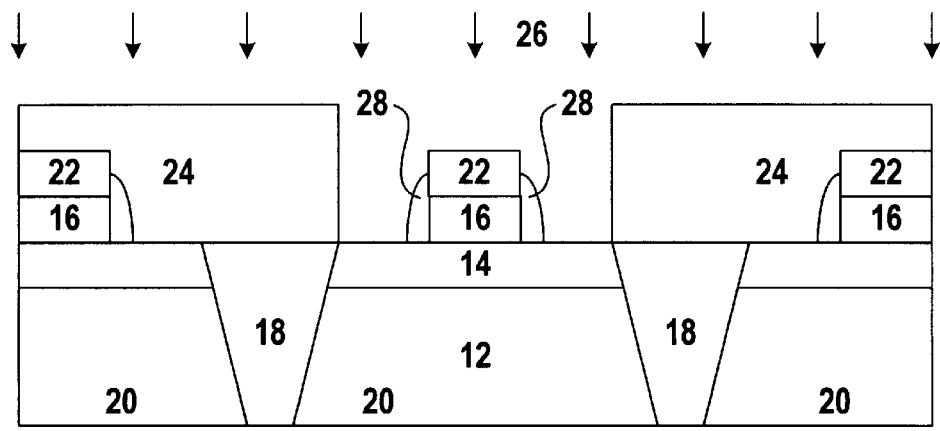
FIG. 6 is a cross sectional representation of the integrated circuit substrate, receiving a source drain deep implant through a soft mask, where the gate electrodes have already been defined in the gate electrode layer and offset spacers have been formed.

FIG. 6 depicts yet another embodiment of the process flow, in which spacers 28 have been formed prior to the implant 26 being performed. The spacers 28 are preferably formed of an electrically nonconductive material, such as silicon oxide or silicon nitride. As explained above in regard to FIGS. 4 and 5, the soft mask 24 is preferably formed over the integrated circuit substrate 10 prior to the implantation 26, so as to limit the implantation 26 to specific portions of the integrated circuit substrate 10. As mentioned at the onset of this portion of the discussion, the soft mask 24 is in each case removed after a first implant, and then reapplied to define other areas of the integrated circuit substrate 10 to receive a dopant implantation of another type.

In each of the three exemplary embodiments described above, the thickness of the gate electrode mask 22 is used in combination with the thickness of either the polysilicon layer 16 or the thickness of the gate electrode precursors 16, which is the same thickness, to prohibit the dopant implant 26 from penetrating the combined thickness of the gate electrode mask 22 and the polysilicon layer 16 and entering the gate oxide 14 which underlies the gate electrode precursors 16 in the first portion of the polysilicon layer 16. By using the combined thickness of the gate electrode mask 22 and the polysilicon layer 16 in this manner, the problems associated with an appreciable dopant concentration penetrating into the channel region of the substrate 12 are avoided. However, at the same time a sufficient level of dopant 26 can be implanted into the gate electrode precursors 16, such that the problems associated with gate depletion, as described above, are likewise avoided.

Thus, the combined thickness of the polysilicon layer 16 and the gate electrode mask 22 is preferably sufficient so as to prevent the dopant 26 from being implanted into the gate oxide 14 in the first portions underlying the gate electrode masks 22. Therefore, the thicknesses of the polysilicon layer 16 and the hard mask material 22 are selected in combination within the ranges given above, and with knowledge of the implant energy used for the dopant 26, to achieve this goal. If a relatively lower implant energy is used, then a relatively thinner combined thickness may be used. On the other hand, if a relatively higher implant energy is to be used, then a relatively thicker combined thickness is preferably used. Similarly, for a given implant energy, if a relatively thinner polysilicon layer 16 is desired, then a relatively thicker hard mask material 22 is preferably formed. Finally, and for the sake of completeness, it is appreciated that for a given implant energy, if a relatively thicker polysilicon layer 16 is desired, then a relatively thinner hard mask material 22 is preferably formed.

It is appreciated that some of the process flows as depicted in FIGS. 4–6 may be more practical than others of the process flows so depicted. However, the various process flows are presented as an indication of the possible latitude in the order of some of the process steps of the preferred embodiments of the method of the present invention.

Figure 7:
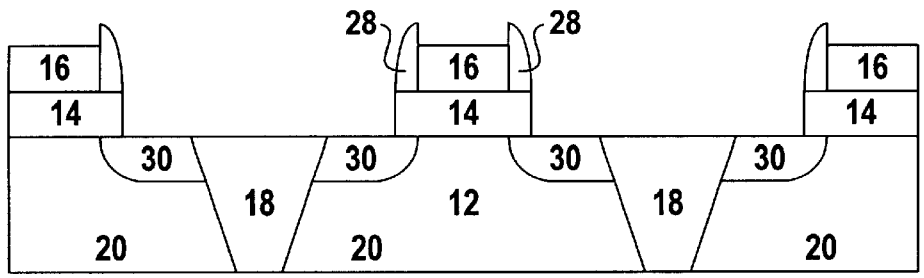
FIG. 7 is a cross sectional representation of the integrated circuit substrate, with the gate electrode mask removed.

FIG. 7 depicts the integrated circuit substrate 10 at a point in processing where the soft mask 24 has been removed, and the gate electrode mask 22 has also been removed. It is appreciated that in the embodiment depicted in FIG. 7, the offset spacers 28 have been formed prior to removal of the gate electrode masks 22, which is why the offset spacers 28 extend past the top of the gate electrode precursors 16. It is further appreciated that the material used to form the offset spacers 28 is in this embodiment different in some manner from the material used to form the gate electrode mask 22, or else the offset spacers 28 would have been removed during the process used to remove the gate electrode masks 22.

Figure 10:
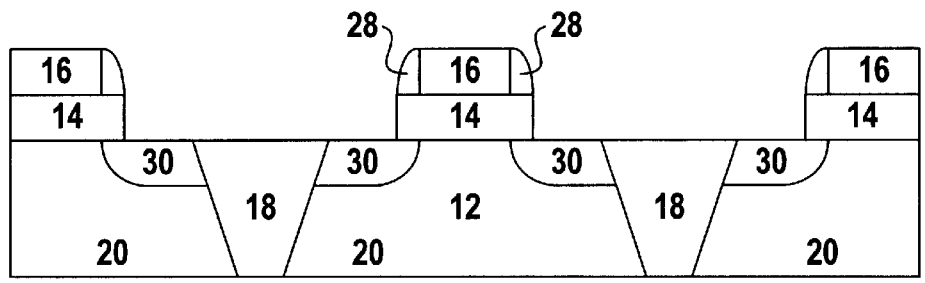
FIG. 10 is a cross sectional representation of the integrated circuit substrate, with the gate electrode mask removed prior to formation of the offset spacers.

Thus, a decision as to which of the process variations, such as depicted in FIGS. 4–6, is made based at least in part upon a choice of the materials selected for the gate electrode masks 22 and the offset spacers 28. If the same material is desired for both structure types, then the implantation 26 and the removal of the gate electrode masks 22 are both preferably accomplished prior to formation of the offset spacers 28, such as depicted in FIGS. 4–5, with resulting structures as depicted in FIG. 10. In such an embodiment, both the gate electrode masks 22 and the offset spacers may be formed of a common material such as silicon oxide or silicon nitride.

However, if a different material is used for the gate electrode masks 22 and the offset spacers 28, then the offset spacers 28 can be formed prior to the removal of the gate electrode masks 22, and may even be formed prior to the implantation of the dopant 26 as depicted in FIG. 6. Thus, the gate electrode masks 22 may in such embodiments be formed of silicon nitride, for example, while the offset spacers are formed of silicon oxide. In such embodiments, the offset spacers 28 are not removed in the process by which the gate electrode masks 22 are removed. It is appreciated, of course, that when different materials are used in this manner for the gate electrode masks 22 and the offset spacers 28, that the process for the removal of the gate electrode masks 22 must be selective between the materials chosen for the formation of the gate electrode masks 22 and the offset spacers 28.

FIGS. 7 and 10 depict the integrated circuit substrate 10 after the dopant 26 has been annealed and activated to form source drain regions 30, and the gate oxide layer 14 has been removed from the exposed second portions of the integrated circuit substrate 10. As mentioned above, the embodiment depicted in FIG. 7 is that case where the offset spacers 28 have been formed prior to the removal of the gate electrode masks 22, and the offset spacers 28 are formed of a different material than the gate electrode masks 22. This embodiment is visually determined by the height of the offset spacers 28 above the top of the gate electrode precursors 16.

FIG. 10 depicts the embodiment where the offset spacers 28 have been formed after the removal of the gate electrode masks 22, and the offset spacers 28 may selectively be formed of the same material as the gate electrode masks 22, or may be formed of a different material. This embodiment is visually determined by the height of the offset spacers 28 being at either about the same level as the top of the gate electrode precursors 16, or below the top of the gate electrode precursors 16.

Figure 8:
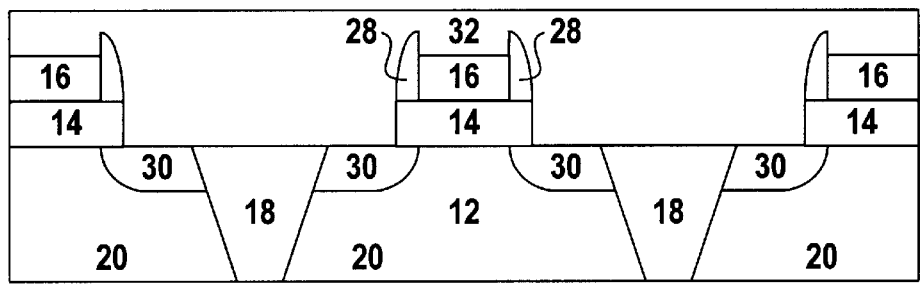
FIG. 8 is a cross sectional representation of the integrated circuit substrate, with an overlying metal layer.

FIG. 8 depicts the integrated circuit substrate 10 after a layer 32 of a metal has been formed on the top surfaces of the integrated circuit substrate 10. As depicted in FIG. 8, the metal layer 32 is a flat, planarized layer. However, this is representational only, and is done for ease in seeing the metal layer 32 in the figure. In actual application, the metal layer 32 would tend to be substantially more conformal to the surface topography of the integrated circuit substrate 10. It is further appreciated that, while the metal layer 32 is depicted in FIG. 8 as overlying structures according to the embodiment depicted in FIG. 7, the application of this and the following process steps is equally applicable to the structures of the embodiment depicted in FIG. 10. Thus, the choice of depicting the following steps in regard to just one of the embodiments was made for convenience only, and not by way of limitation.

Figure 9:
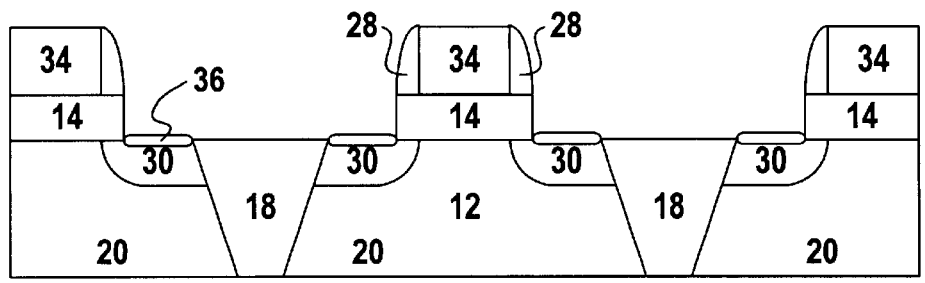
FIG. 9 is a cross sectional representation of the integrated circuit substrate, with a substantially completely silicided gate electrode and silicide source drain contacts.

The metal layer 32 is preferably formed of a metal such as any one or more of cobalt, nickel, titanium, platinum, and tantalum. The metal 32 is preferably selected so as to be able to form a silicide with the polysilicon of the gate electrode precursors 16. The metal layer 32 is preferably formed to a thickness of between about one hundred angstroms and about two hundred angstroms. The thickness of the metal layer 32 is preferably determined based at least in part upon that thickness of metal layer 32 that will substantially completely consume the thickness of the gate electrode precursor 16 during a silicide anneal process step. In other words, the thickness of the metal layer 32 is preferably just thick enough so as to convert the entire thickness of the polysilicon gate electrode precursor 16 into a silicide gate electrode 34, as depicted in FIG. 9, where there is substantially no polysilicon material left remaining.

Thus, the thickness of the metal layer 32 can be somewhat greater than such a required thickness, but is preferably no less than such a required thickness. Further, the exact thickness of the metal layer 32 so required depends at least in part upon the thickness of the polysilicon gate electrode precursor 16, the thickness of which is determined upon parameters as described above.

The silicide gate electrodes 34 may be further doped after they are formed, to further tailor the work function of the gate electrodes 34. By forming the gate electrodes 34 as described above, a very thin gate electrode 34 can be formed without encountering the problems of either doping the gate oxide 14 or gate depletion, as described above. Thus, the polysilicon layer 16 can have some amount of dopant in it as it is formed, or the gate electrode precursors 16 can be doped through the hard mask 22 with an implant, or the silicide gate electrodes 34 can be doped after formation, or one or more of the above options can be accomplished in combination, all to more finely tune the work function of the resulting gate electrode 34 as desired.

During the silicide process by which the silicide gate electrode 34 is formed, silicide electrical contacts 36 are preferably also formed in the source drain regions 30 of the integrated circuit substrate 10. After this point, processing of the integrated circuit substrate 10 preferably continues according to normal CMOS processing. It is also appreciated that there are other steps in normal CMOS processing that are preferably accomplished between the novel steps of the process as described above. However, these normal processing steps have been substantially omitted in the discussion herein because they are well known in the art, and thus a determination of where they may be accomplished is easily made. Thus, the description above is limited to those steps which are a more novel combination.

For example, an LDD mask and implant can be accomplished, such as after the polysilicon gate electrode precursors 16 have been formed. Additionally, various cleans of the integrated circuit substrate 10 are accomplished at various points in the processing as described above. Further, various photolithography steps are inherent in the discussion above, but for the most part have not been described. It is appreciated that all such processing is well understood by those with skill in the art, and that a discussion of such is not necessary herein.

The foregoing description of preferred embodiments for this invention has been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a CMOS process flow, a method of fabricating a substantially completely silicided polysilicon gate electrode, the improvement comprising the steps of:

a) forming a hard mask material on an integrated circuit substrate, where the integrated circuit substrate includes an unpatterned polysilicon layer that overlies a gate oxide layer and a well region disposed between isolation structures, b) removing portions of the hard mask material to define gate electrode masks that overlie first portions of the unpatterned polysilicon layer and the gate oxide layer, and leave exposed second portions of the unpatterned polysilicon layer and the gate oxide layer, c) exposing the integrated circuit substrate to a dopant that passes through the second portions of the gate oxide layer but does not penetrate the first portions of the gate oxide layer that underlie the gate electrode masks, to define source drain regions in the well region, d) removing the exposed second portions of the unpatterned polysilicon layer to define polysilicon gate electrode precursors under the gate electrode masks, e) removing the gate electrode masks from the polysilicon gate electrode precursors, f) depositing a metal layer over the polysilicon gate electrode precursors and the source drain regions, and g) annealing the integrated circuit substrate to substantially completely consume the polysilicon gate electrode precursors and form silicide gate electrodes from the polysilicon gate electrode precursors and the overlying metal layer, and also to form silicide contacts in the source drain regions.

2. The method of claim 1, wherein the hard mask material has a first thickness and the unpatterned polysilicon layer has a second thickness and the metal layer has a third thickness, and the combined first thickness of the hard mask material and the second thickness of the unpatterned polysilicon layer is sufficient to prohibit the dopant from penetrating the first portions of the gate oxide layer, and the third thickness of the metal layer is just sufficient to substantially completely consume the first thickness of the polysilicon gate electrode precursors and form silicide gate electrodes during the annealing step.

3. The method of claim 2, wherein the first thickness of the unpatterned polysilicon layer is between about three hundred angstroms about four hundred angstroms, the second thickness of the hard mask material is between about three hundred angstroms and about eight hundred angstroms, and the third thickness of the metal layer is between about one hundred angstroms and about two hundred angstroms.

4. The method of claim 1, wherein the hard mask material is at least one of silicon nitride, silicon oxide, and silicon oxynitride.

5. The method of claim 1, wherein the metal layer is formed of at least one of cobalt, nickel, titanium, platinum, and tantalum.

6. The method of claim 1, wherein the unpatterned polysilicon layer is doped prior to formation of the hard mask material.

7. The method of claim 1, wherein the unpatterned polysilicon layer is doped prior to formation of the hard mask material to tailor a work function of the silicide gate electrodes.

8. The method of claim 1, wherein the polysilicon gate precursors are doped prior to the deposition of the metal layer to tailor a work function of the silicide gate electrodes.

9. The method of claim 1, wherein the silicide gate electrodes are doped after formation to tailor a work function of the silicide gate electrodes.

10. In a CMOS process flow, a method of fabricating a substantially completely silicided polysilicon gate electrode, the improvement comprising the steps of:
   a) forming a hard mask material on an integrated circuit substrate, where the integrated circuit substrate includes an unpatterned polysilicon layer that overlies a gate oxide layer and a well region disposed between isolation structures,
   b) removing portions of the hard mask material to define gate electrode masks that overlie first portions of the unpatterned polysilicon layer and the gate oxide layer, and leave exposed second portions of the unpatterned polysilicon layer and the gate oxide layer,
   c) forming a source drain deep implant soft mask over portions of the integrated circuit substrate,
   d) exposing the integrated circuit substrate to a dopant that passes through the exposed second portions of the unpatterned polysilicon layer and the gate oxide layer but does not penetrate the first portions of the gate oxide layer that underlie the gate electrode masks, and does not pass through the source drain deep implant soft mask, to define source drain regions in the well region,
   e) removing the source drain deep implant soft mask,
   f) removing the exposed second portions of the unpatterned polysilicon layer to define polysilicon gate electrode precursors under the gate electrode masks,
   g) forming offset spacers adjacent the polysilicon gate electrode precursors and the gate electrode masks,
   h) annealing the integrated circuit substrate to activate the source drain regions,
   i) removing the gate electrode masks from the polysilicon gate electrode precursors,
   j) depositing a metal layer over the polysilicon gate electrode precursors and the source drain regions, and
   k) annealing the integrated circuit substrate to substantially completely consume the polysilicon gate electrode precursors and form silicide gate electrodes from the polysilicon gate electrode precursors and the overlying metal layer, and also to form silicide contacts in the source drain regions.

11. The method of claim 10, wherein the hard mask material is formed of a different material than the offset spacers.

12. The method of claim 10, wherein step (i) is performed prior to step (g).

13. The method of claim 12, wherein the hard mask material and the offset spacers are formed of the same material.

14. The method of claim 10, wherein the hard mask material has a first thickness and the unpatterned polysilicon layer has a second thickness and the metal layer has a third thickness, and the combined first thickness of the hard mask material and the second thickness of the unpatterned polysilicon layer is sufficient to prohibit the dopant from penetrating the first portions of the gate oxide layer, and the third thickness of the metal layer is just sufficient to substantially completely consume the first thickness of the polysilicon gate electrode precursors and form silicide gate electrodes during the annealing step.

15. The method of claim 10, wherein the hard mask material is at least one of silicon nitride, silicon oxide, and silicon oxynitride.

16. The method of claim 10, wherein the metal layer is formed of at least one of cobalt, nickel, titanium, platinum, and tantalum.

17. In a CMOS process flow, a method of fabricating a substantially completely silicided polysilicon gate electrode, the improvement comprising the steps of:
   a) forming a hard mask material on an integrated circuit substrate, where the integrated circuit substrate includes an unpatterned polysilicon layer that overlies a gate oxide layer and a well region disposed between isolation structures,
   b) removing portions of the hard mask material to define gate electrode masks that overlie first portions of the unpatterned polysilicon layer and the gate oxide layer, and leave exposed second portions of the unpatterned polysilicon layer and the gate oxide layer,
   c) removing the exposed second portions of the unpatterned polysilicon layer to define polysilicon gate electrode precursors under the gate electrode masks, and expose the second portions of the gate oxide layer,
   d) forming offset spacers adjacent the polysilicon gate electrode precursors and the gate electrode masks,
   e) forming a source drain deep implant soft mask over portions of the integrated circuit substrate,
   f) exposing the integrated circuit substrate to a dopant that passes through the exposed second portions of the gate oxide layer but does not penetrate the first portions of the gate oxide layer that underlie the polysilicon gate electrode precursors and the gate electrode masks, and does not pass through the source drain deep implant soft mask or the offset spacers, to define source drain regions in the well region, g) removing the source drain deep implant soft mask, h) annealing the integrated circuit substrate to activate the source drain regions, i) removing the gate electrode masks from the polysilicon gate electrode precursors, j) depositing a metal layer over the polysilicon gate electrode precursors and the source drain regions, and k) annealing the integrated circuit substrate to substantially completely consume the polysilicon gate electrode precursors and form silicide gate electrodes from the polysilicon gate electrode precursors and the overlying metal layer, and also to form silicide contacts in the source drain regions.

18. The method of claim 17, wherein the hard mask material has a first thickness and the unpatterned polysilicon layer has a second thickness and the metal layer has a third thickness, and the combined first thickness of the hard mask material and the second thickness of the unpatterned polysilicon layer is sufficient to prohibit the dopant from penetrating the first portions of the gate oxide layer, and the third thickness of the metal layer is just sufficient to substantially completely consume the first thickness of the polysilicon gate electrode precursors and form silicide gate electrodes during the annealing step.

19. The method of claim 17, wherein the hard mask material is at least one of silicon nitride, silicon oxide, and silicon oxynitride.

20. The method of claim 17, wherein the metal layer is formed of at least one of cobalt, nickel, titanium, platinum, and tantalum.

* * * * *